(12) United States Patent
Kanaya et al.

(10) Patent No.: US 7,591,908 B2
(45) Date of Patent: Sep. 22, 2009

(54) VAPOR DEPOSITION APPARATUS AND VAPOR DEPOSITION METHOD

(75) Inventors: Koichi Kanaya, Nishishirakawa-gun (JP); Toru Otsuka, Nishishirakawa-gun (JP); Takao Kanno, Nishishirakawa-gun (JP)

(73) Assignee: Shin-Etsu Handotai Co., Ltd, Tokyo (JP)

( * ) Notice: Subject to any disclaimer, the term of this patent is extended or adjusted under 35 U.S.C. 154(b) by 0 days.

(21) Appl. No.: 10/565,653

(22) PCT Filed: Apr. 26, 2004

(86) PCT No.: PCT/JP2004/006007

§ 371 (c)(1),
(2), (4) Date: Jan. 24, 2006

(87) PCT Pub. No.: WO2005/013343

PCT Pub. Date: Feb. 10, 2005

(65) Prior Publication Data

US 2006/0180076 A1 Aug. 17, 2006

(30) Foreign Application Priority Data

Aug. 1, 2003 (JP) ............................. 2003-284912

(51) Int. Cl.
*C23C 16/00* (2006.01)
*C23F 1/00* (2006.01)
*H01L 21/306* (2006.01)

(52) U.S. Cl. ................ 118/728; 156/345.51; 427/248.1

(58) Field of Classification Search ................. 118/728; 156/345.51; 427/248.1
See application file for complete search history.

(56) References Cited

U.S. PATENT DOCUMENTS

| | | | | |
|---|---|---|---|---|
| 5,088,697 A | * | 2/1992 | Murakami et al. | 266/250 |
| 5,303,574 A | * | 4/1994 | Matossian et al. | 73/7 |
| 5,444,217 A | * | 8/1995 | Moore et al. | 219/405 |
| 6,162,706 A | * | 12/2000 | Dutartre et al. | 438/481 |
| 6,284,048 B1 | * | 9/2001 | Van Bilsen et al. | 118/666 |
| 2002/0066412 A1 | * | 6/2002 | Yao et al. | 118/728 |

FOREIGN PATENT DOCUMENTS

EP 0 092 435 10/1983
JP A 59-32123 2/1984

(Continued)

OTHER PUBLICATIONS

English Translation of JP 2000355766 A.*

(Continued)

*Primary Examiner*—Michael Cleveland
*Assistant Examiner*—Keath T Chen
(74) *Attorney, Agent, or Firm*—Oliff & Berridge, PLC

(57) ABSTRACT

In a vapor phase growth apparatus for performing a vapor phase growth of a silicon epitaxial layer on a main surface of a silicon single crystal substrate while heating the silicon single crystal substrate placed on a pocket formed on a susceptor, from both sides, the pocket has an outer peripheral side part which supports a rear surface of the silicon single crystal substrate and an inner peripheral side part which is kept in a state of being more recessed than the outer peripheral side part in the inside of the outer peripheral side part, and the susceptor has a warped inverted U-shaped longitudinal sectional shape.

2 Claims, 3 Drawing Sheets

FOREIGN PATENT DOCUMENTS

| | | |
|---|---|---|
| JP | A-61-215289 | 9/1986 |
| JP | A-62-262417 | 11/1987 |
| JP | A-01-256118 | 10/1989 |
| JP | A-06-302550 | 10/1994 |
| JP | 07-335572 * | 12/1995 |
| JP | A-2000-269150 | 9/2000 |
| JP | 2000355766 A * | 12/2000 |
| JP | A-2002-134484 | 5/2002 |
| JP | A-2003-197546 | 7/2003 |
| JP | A-2003-203866 | 7/2003 |

OTHER PUBLICATIONS

Machine English translation of entire JP 2000-355766 (translatation date Mar. 10, 2008), inventor Fumihide et al.*

English translation JP 07-335572, Dec. 1995, Yukio.*

* cited by examiner

VAPOR DEPOSITION APPARATUS AND VAPOR DEPOSITION METHOD

TECHNICAL FIELD

The present invention relates to a vapor phase growth apparatus for performing a vapor phase growth of a silicon epitaxial layer on a main surface of a silicon single crystal substrate, and a vapor phase growth method using the apparatus.

BACKGROUND ART

Conventionally, a so-called single wafer vapor phase growth apparatus is known as an apparatus for growing a silicon epitaxial layer on a main surface of a silicon single crystal substrate. The single wafer vapor phase growth apparatus has an almost disk-shaped susceptor for supporting the silicon single crystal substrate, and can perform a vapor phase growth of the silicon epitaxial layer by heating the silicon single crystal substrate on the susceptor from both sides as well as by feeding silicon raw materials onto a main surface of the substrate. More specifically, the susceptor has a pocket for positioning the silicon single crystal substrate in a central part of the main surface and is designed to support the silicon single crystal substrate within the pocket.

Incidentally, when the silicon single crystal substrate is nonuniformly heated, slip dislocation easily occurs in the silicon epitaxial layer formed on an upper part of a thermally stressed part of the main surface. Therefore, in order to prevent this slip dislocation from occurring, for example, a susceptor having a pocket of which a bottom surface in the central part is made deeper than that in the outer peripheral part (see, e.g., Japanese Patent Application Publication Unexamined Tokukaisho-61-215289) or a susceptor having a pocket of which a bottom surface is swelled out in a shape of a spherical surface (see, e.g., Japanese Patent Application Publication Unexamined Tokukaisho-62-262417) is used in the vapor phase growth apparatus to uniformly heat the silicon single crystal substrate.

However, even if the susceptors disclosed in the above-described two documents are used, an occurrence frequency of the slip dislocation varies by individual susceptors. Therefore, the improvement is required so that the occurrence of the slip dislocation can be surely reduced irrespective of differences in susceptors.

An object of the present invention is to provide a vapor phase growth apparatus capable of surely reducing the occurrence frequency of the slip dislocation and a vapor phase growth method using the apparatus.

DISCLOSURE OF THE INVENTION

In order to solve these problems, a vapor phase growth apparatus for performing a vapor phase growth of a silicon epitaxial layer on a main surface of a silicon single crystal substrate while heating the silicon single crystal substrate placed on a pocket formed on a susceptor, from both sides, wherein the pocket has an outer peripheral side part which supports a rear surface of the silicon single crystal substrate and an inner peripheral side part which is kept in a state of being more recessed than the outer peripheral side part in the inside of the outer peripheral side part, and the susceptor has a warped inverted U-shaped longitudinal sectional shape.

Herein, even if the susceptors having the same type of pocket shape are used, the occurrence frequency of the slip dislocation varies by individual susceptors. The reason why is that in a manufacturing process of susceptors, a part of the susceptors are manufactured to have a warped U shape in a longitudinal sectional view, and as a result, a distance between a rear surface of the silicon single crystal substrate and a bottom surface of the pocket increases.

More specifically, the susceptor is normally formed by heat-treating a body section composed of graphite to have a high degree of purity and then coating a surface of the body section with SiC (silicon carbide). In the heat-treating, the susceptor is formed to have a warped U shape in a longitudinal sectional view as shown in FIG. 3. Alternatively, the susceptor is formed to have a warped inverted U shape in a longitudinal sectional view as shown in FIG. 2A. Further, in the susceptors disclosed in the above-described two documents, when the susceptor 50 (see FIG. 3) with a warped U shape in the longitudinal sectional view is used to perform a vapor phase growth of the silicon epitaxial layer, a distance between a bottom surface 52 of the pocket and a rear surface of the silicon single crystal substrate W is D+α which is larger than a distance D between the bottom surface of the pocket and the rear surface of the silicon single crystal substrate W in the case of a flat susceptor by an elevation difference α between the position corresponding to a central part of the pocket and the position corresponding to a supporting section of the silicon single crystal substrate W in a rear surface of the susceptor. Accordingly, in this case, a temperature difference between a central part and outer peripheral part on the main surface side of the silicon single crystal substrate W increases and therefore, thermal stress applied to the outer peripheral part of the main surface of the silicon single crystal substrate W increases. As a result, slip dislocation occurs in the silicon epitaxial layer formed on the outer peripheral part.

As described above, the slip dislocation occurs when the distance between the silicon single crystal substrate W and the bottom surface of the inner peripheral side part more recessed than the outer peripheral side part of the pocket which supports the rear surface of the silicon single crystal substrate W increases. Therefore, when the distance decreases, the occurrence frequency of the slip dislocation does not increase.

Consequently, a susceptor 2 having a warped inverted U-shaped longitudinal sectional shape as shown in FIG. 2A is selectively used to perform the vapor phase growth in a state where the distance between a bottom surface 21a of the pocket and the silicon single crystal substrate W is more reduced than a value D in the case of using a flat susceptor 2 by the amount of warping β. As a result, in this case, as compared with a case of using the susceptor 50 having a warped U shape in a longitudinal sectional view, a temperature difference between the central part and outer peripheral part on the main surface side of the silicon single crystal substrate W decreases during the vapor phase growth. Further, thermal stress is hardly applied to the outer peripheral part of the silicon single crystal substrate W, and as a result, the occurrence frequency of the slip dislocation can be surely reduced.

When the pocket is formed for a silicon single crystal substrate with a diameter of 300 mm or more, a maximum distance between the bottom surface of the inner peripheral side part in the pocket and the rear surface of the silicon single crystal substrate is preferably less than 0.4 mm. In this case, the occurrence frequency of the slip dislocation can be surely reduced. On the other hand, when the maximum distance between the bottom surface of the inner peripheral side part in the pocket and the rear surface of the silicon single crystal substrate is 0.4 mm or more, the occurrence frequency of the slip dislocation remarkably increases.

Further, when the susceptor is excessively warped in an inverted U shape in the longitudinal sectional view, the rear surface of the silicon single crystal substrate comes into contact with the bottom surface of the pocket, and as a result, the rear surface of the silicon single crystal substrate is scratched. Particularly, when the rear surface is subjected to mirror surface processing, the scratch stands out and therefore, this susceptor is not preferred.

In the case where the susceptor is a type of a single wafer, when a warpage size of the inverted U shape is represented by a curvature, the curvature on the rear surface side of the susceptor is preferably $1.75 \times 10^{-5}$ mm$^{-1}$ or less. When the warpage is as small as this curvature, occurrence of the scratch is prevented from standing out in the rear surface of the substrate, excepting the case where the pocket of the susceptor is extremely shallow. A single wafer susceptor means that the susceptor is used for a single wafer vapor phase growth apparatus. Further, the curvature on the rear surface side of the susceptor is represented by an inverse number $1/r$ of a value r calculated from $r^2=(r-(\text{an elevation difference between the position corresponding to a central part of the pocket and the position corresponding to a supporting section of the silicon single crystal substrate in the rear surface of the susceptor}))^2+(\text{a radius of the silicon single crystal substrate})^2$ when representing a curvature radius by r.

Specifically, for example, in the case where the susceptor which is a single wafer one used for a silicon single crystal substrate having a diameter of 300 mm and which is formed such that the distance between the central part of the rear surface of the silicon single crystal substrate and the bottom surface of the inner peripheral side part in the pocket is 0.2 mm in a state where the substrate is not deflected has a warped inverted U shape in a longitudinal sectional view, when a curvature on the rear surface side of the susceptor is larger than $1.75 \times 10^{-5}$ mm$^{-1}$, the bottom surface of the pocket comes into contact with the rear surface of the silicon single crystal substrate, and as a result, the rear surface of the substrate is scratched.

Further, the vapor phase growth method of the present invention comprises performing a vapor phase growth of a silicon epitaxial layer on a main surface of a silicon single crystal substrate using the vapor phase growth apparatus of the present invention.

BEST MODE FOR CARRYING OUT THE INVENTION

Embodiments of a vapor phase growth apparatus according to the present invention will be described below with reference to the accompanying drawings. The vapor phase growth apparatus of the present embodiment is a single wafer vapor phase growth apparatus for performing a vapor phase growth of an epitaxial layer on a main surface of a silicon single crystal substrate having a diameter of 300 mm.

Figure 1:
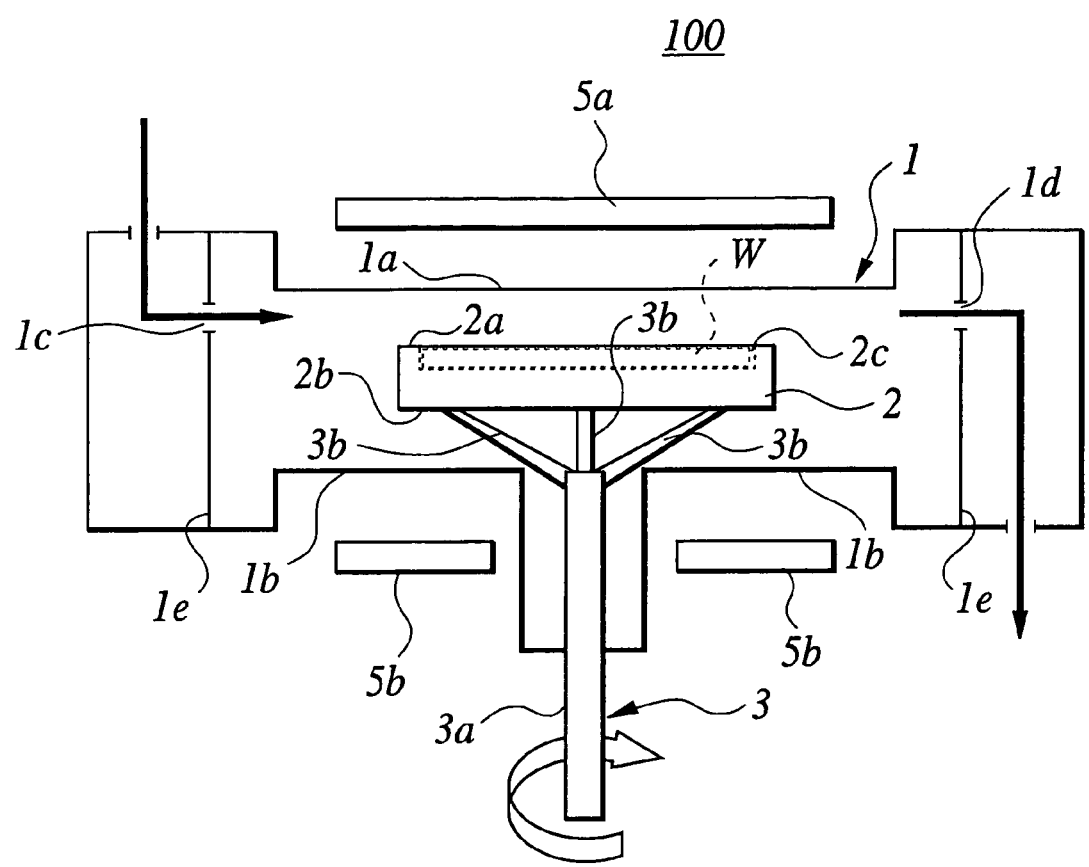
FIG. 1 is a longitudinal sectional view showing a schematic construction of an embodiment of a vapor phase growth apparatus according to the present invention.

FIG. 1 is a longitudinal sectional view showing a schematic construction of a vapor phase growth apparatus 100. The vapor phase growth apparatus 100 has a reactor 1 in which the silicon single crystal substrate W is disposed.

The reactor 1 is a reaction chamber having a top wall 1$a$, a bottom wall 1$b$ and side walls 1$e$. The top wall 1$a$ and the bottom wall 1$b$ are made of translucent quartz. On the side walls 1$e$, a gas supply port 1$c$ for supplying a reaction gas used for vapor phase growth to the reactor 1 inside and a gas exhaust port 1$d$ for exhausting the reaction gas from the reactor 1 are formed. To the gas supply port 1$c$, a gas supply apparatus (not shown) which supplies a reaction gas with a predetermined composition and flow rate is connected. As the reaction gas, for example, a mixed gas composed of a SiHCl$_3$ (trichlorosilane) gas as a raw material gas and a H$_2$ gas as a carrier gas is preferably used in the vapor phase growth of the silicon epitaxial layer on the silicon single crystal substrate.

A heating unit 5$a$ which performs radiation toward the reactor 1 inside through the top wall 1$a$ is installed above the reactor 1 and a heating unit 5$b$ which performs radiation toward the reactor 1 inside through the bottom wall 1$b$ is installed below the reactor 1. In the present embodiment, halogen lamps are used as the heating units 5$a$ and 5$b$.

Further, in the reactor 1, an almost disk-shaped susceptor 2 for placing the silicon single crystal substrate W is disposed in a state of being supported by a supporting member 3.

The susceptor 2 is one formed by coating graphite with silicon carbide (SiC).

Figure 2A:
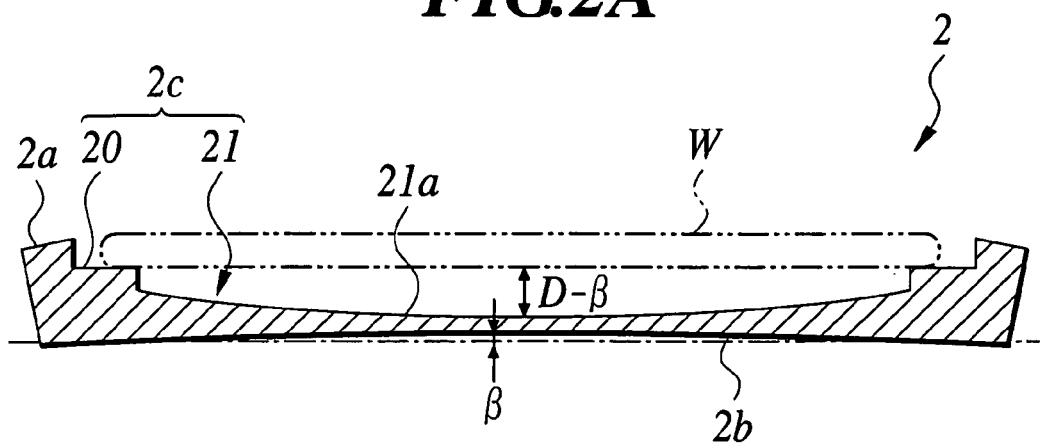
FIG. 2A is a longitudinal sectional view of a susceptor according to the present invention.

A longitudinal sectional view of the susceptor 2 is shown in FIG. 2A. As shown in this figure, the susceptor 2 has a warped inverted U-shaped longitudinal sectional shape. A curvature on a rear surface 2$b$ side of the susceptor 2 is $1.75 \times 10^{-5}$ mm$^{-1}$ or less. An almost circular pocket 2$c$ is formed on a main surface 2$a$, namely, an upper surface of the susceptor 2.

The pocket 2$c$ is formed to have a double structure having an outer peripheral side part 20 which supports the silicon single crystal substrate W as well as an inner peripheral side part 21 which is formed in a state of being more recessed than the outer peripheral side part 20 in the inside of the outer peripheral side part 20. A bottom surface 21$a$ of the pocket 2$c$, namely, a bottom surface 21$a$ of the inner peripheral side part 21 in the pocket 2$c$ is formed to have a U shape in the longitudinal sectional view. In more detail, the bottom surface 21$a$ of the pocket 2$c$ is formed to have a maximum distance of less than 0.4 mm from the rear surface of the silicon single crystal substrate W. In the present embodiment, the maximum distance between the bottom surface 21$a$ of the pocket 2$c$ and the rear surface of the silicon single crystal substrate W is synonymous with the depth within the pocket. The depth within the pocket can be obtained from measurement charts drawn up by placing, on a surface table, the susceptor 2 with the main surface side facing up and by performing the measurement in the diametrical parallel using a laser displacement gauge. Further, as shown in FIG. 1, the silicon single crystal substrate W placed within the pocket 2$c$ is heated from above by the heating unit 5$a$ as well as is heated from below through the susceptor 2 by the heating unit 5$b$, although it is not shown in FIG. 2A.

Figure 2B:
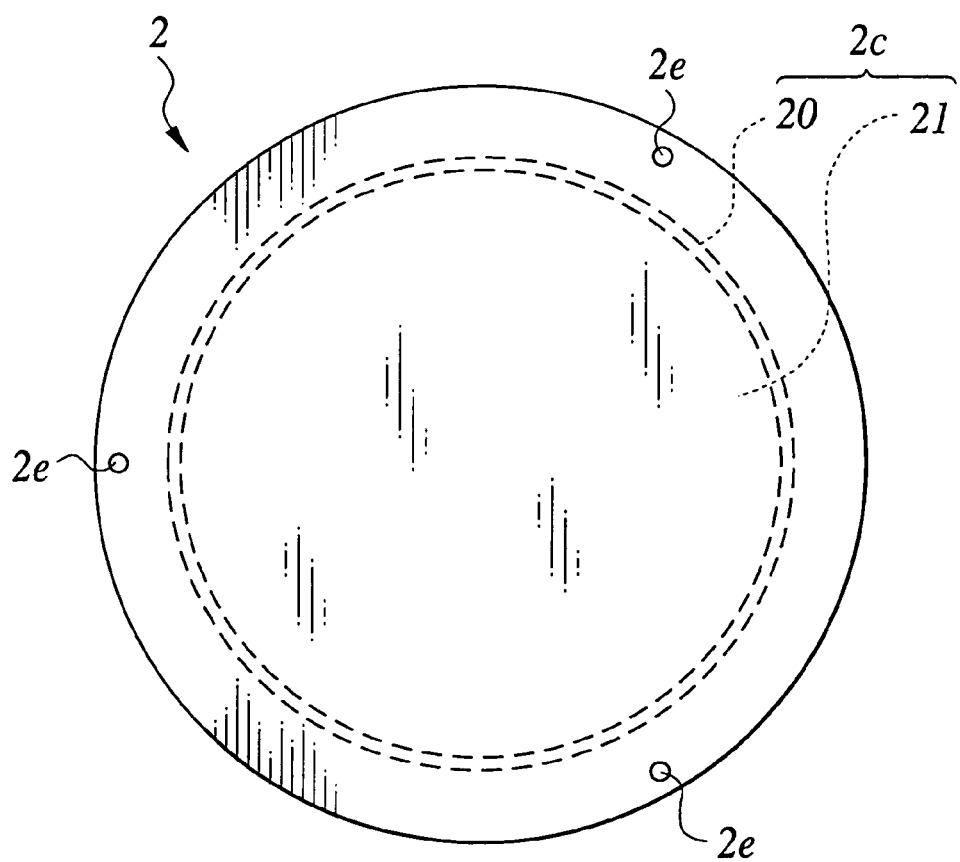
FIG. 2B is a plan view showing a rear surface of a susceptor according to the present invention.
Figure 3:
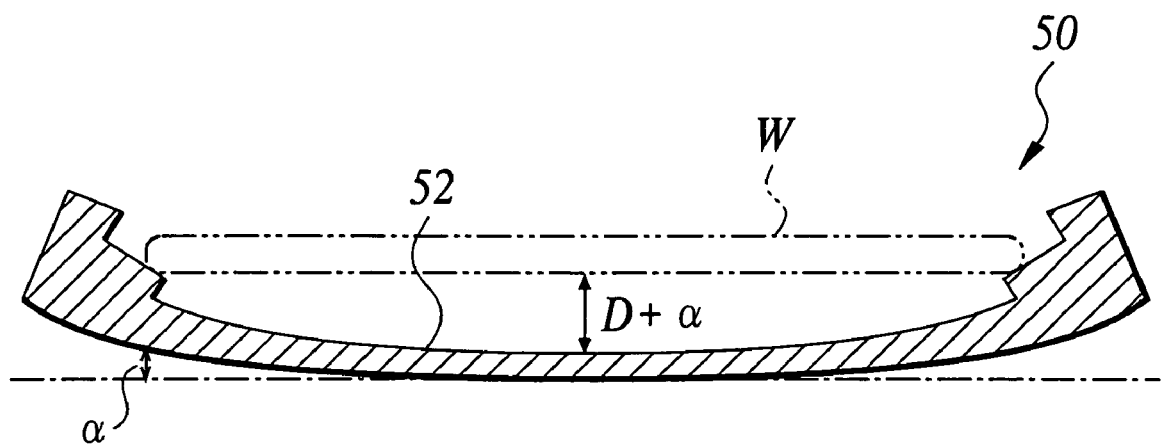
FIG. 3 is a longitudinal sectional view of a conventional susceptor.

Further, FIG. 2B shows a plan view of the rear surface 2$b$ side of the susceptor 2. As shown in this figure, three concave parts 2$e$ which are open to the rear surface of the susceptor 2 are provided in a portion on the outer side than the pocket 2$c$.

As shown in FIG. 1, the supporting member 3 has a rotation shaft 3$a$ vertically extending below the susceptor 2. Three spokes 3$b$ which are radially branched obliquely upward are provided on a top end of the rotation shaft 3a. Each end of the spokes 3b is engaged with the concave part 2e of the susceptor 2 to support the susceptor 2. A rotary drive device (not shown) is connected to the rotation shaft 3a to allow the rotation shaft 3a and the susceptor 2 to rotate by the drive of the rotary drive device.

Next, a vapor phase growth method for performing the vapor phase growth of a silicon epitaxial layer on a silicon single crystal substrate using the above-described vapor phase growth apparatus 100 will be described.

First, the silicon single crystal substrate is carried and placed within the pocket 2c of the susceptor 2. Herein, since the susceptor 2 is warped in the inverted U shape in a longitudinal sectional view, a distance between the bottom surface 21a of the pocket 2c and the rear surface of the silicon single crystal substrate W is small as compared with a case where the susceptor 2 is warped in the U shape in a longitudinal sectional view.

Next, the silicon single crystal substrate is heated by the heating units 5a and 5b as well as the susceptor 2 is rotated by the rotary drive device. In this state, a mixed gas composed of a $SiHCl_3$ gas and a $H_2$ gas is introduced as a reaction gas into the reactor 1 from the gas supply port 1c to perform the vapor phase growth. At this time, the vapor phase growth is performed in a state where a temperature difference between the central part and outer peripheral part on the main surface side of the silicon single crystal substrate W is as small as the distance between the bottom surface 21a of the pocket 2c and the rear surface of the silicon single crystal substrate W decreases as compared with the case of using the U-shaped susceptor in the longitudinal sectional view as described above.

According to the above-described vapor phase growth apparatus 100, the vapor phase growth can be performed in a state where a temperature difference between the central part and outer peripheral part on the main surface side of the silicon single crystal substrate W is reduced as compared with the case of using the U-shaped susceptor in the longitudinal sectional view. In other words, the vapor phase growth can be performed while suppressing thermal stress applied to the outer peripheral part of the silicon single crystal substrate W, so that the occurrence frequency of slip dislocation can be surely reduced.

Further, when the maximum distance between the bottom surface 21a of the pocket 2c and the rear surface of the silicon single crystal substrate W, namely, the depth within the pocket is less than 0.4 mm, the occurrence frequency of the slip dislocation can be surely reduced as shown in the following Table 1.

TABLE 1

| Shape of Susceptor | ∩ | ∩ | ∩ | ∪ | ∪ |
|---|---|---|---|---|---|
| Depth within Pocket (mm) | 0.23 | 0.32 | 0.38 | 0.48 | 0.53 |
| Occurrence of Slip Dislocation | ○ | ○ | ○ | X | X |

(○: no slip dislocation occurs, X: slip dislocation occurs)

In the table, the term "Shape of Susceptor" means a longitudinal sectional shape of the susceptor, the symbol "∪" indicates a U shape and the symbol "∩" indicates an inverted U shape.

In the above-described embodiment, the vapor phase growth apparatus 100 as a single wafer type of one is described. Further, as long as the apparatus supports the silicon single crystal substrate W within the pocket in the almost horizontal direction, for example, a batch type of one for performing the vapor phase growth of silicon epitaxial layers on a plurality of the silicon single crystal substrates at the same time, may be used.

Further, a case of the vapor phase growth of the silicon epitaxial layer on the main surface of the silicon single crystal substrate having a diameter of 300 mm is described. As a diameter of the silicon single crystal substrate is larger, a depth within the pocket must be more reduced in order to reduce slip dislocation, and therefore, the present invention is similarly applicable also to a silicon single crystal substrate having a diameter of more than 300 mm.

INDUSTRIAL APPLICABILITY

As described above, the vapor phase growth method and the vapor phase growth apparatus according to the present invention are useful for surely reducing the occurrence frequency of the slip dislocation and are suited particularly to a case of the vapor phase growth of the epitaxial layer on the main surface of the silicon single crystal substrate.

The invention claimed is:

1. A method of vapor phase growth with reduced slip dislocation frequency, comprising:
    providing a silicon single crystal substrate of 300 mm or more, the substrate having a main surface and a rear surface;
    heat treating at least one susceptor having a body section formed of graphite and coated with silicon carbide (SiC), the susceptor body section having a longitudinal length and also including
        a pocket formed on the susceptor, the susceptor pocket having an outer peripheral side part which is capable of supporting the rear surface of the silicon single crystal substrate and an inner peripheral side part defining a bottom surface which is kept in a state of being more recessed than the outer peripheral side part in an inside of the outer peripheral side
    part, wherein the pocket has an initial maximum depth D defined between the bottom surface of the inner peripheral side part in the pocket and a plane defining the location of the rear surface of the silicon single crystal substrate when mounted on the outer peripheral side part over the pocket;
    selecting a heat treated susceptor from among the at least one susceptor in which the body section has warped along the longitudinal length in an inverted U-shape so that after heat treatment the pocket has a reduced pocket depth (D−β) that has been reduced due to the inverted U-shaped warping by warping amount β;
    mounting the silicon single crystal substrate on the outer peripheral side part of the selected susceptor over the pocket;
    performing a vapor phase growth of a silicon epitaxial layer on the main surface of the substrate by heating the silicon single crystal substrate from above and from below with an upper heating unit and a lower heating unit; and
    forming the resultant substrate as a result of vapor phase growth with reduced slip dislocation frequency.

2. The method as claimed in claim 1, wherein
    the susceptor is a type of a single wafer, and
    a curvature on a rear surface side of the susceptor is $1.75 \times 10^{-5}$ $mm^{-1}$ or less.

* * * * *